(12) United States Patent
Satou et al.

(10) Patent No.: US 7,242,197 B2
(45) Date of Patent: Jul. 10, 2007

(54) CURRENT MEASURING APPARATUS, TEST APPARATUS, AND COAXIAL CABLE AND ASSEMBLED CABLE FOR THE APPARATUSES

(75) Inventors: Mitsunori Satou, Sowa-machi (JP); Yasuo Furukawa, Tokyo (JP)

(73) Assignees: Advantest Corporation, Tokyo (JP); Hirakawa Hewtech Corporation, Tokyo (JP)

(*) Notice: Subject to any disclaimer, the term of this patent is extended or adjusted under 35 U.S.C. 154(b) by 0 days.

(21) Appl. No.: 11/385,247

(22) Filed: Mar. 21, 2006

(65) Prior Publication Data

US 2006/0202704 A1    Sep. 14, 2006

Related U.S. Application Data

(63) Continuation of application No. PCT/JP2004/013753, filed on Sep. 21, 2004.

(30) Foreign Application Priority Data

Sep. 22, 2003  (JP) ............................... 2003-330732

(51) Int. Cl.
G01R 31/08 (2006.01)
G01R 27/08 (2006.01)
(52) U.S. Cl. ..................... 324/522; 324/713
(58) Field of Classification Search ............... 324/522, 324/713
See application file for complete search history.

(56) References Cited

U.S. PATENT DOCUMENTS 4,494,181 A * 1/1985 Ramlohr et al. .............. 363/63
5,066,904 A * 11/1991 Bullock ....................... 324/127
5,463,188 A * 10/1995 Nohmi et al. ................ 174/108
5,532,590 A * 7/1996 Yamanaka ................... 324/713
6,479,976 B1 * 11/2002 Edel ............................. 323/357

FOREIGN PATENT DOCUMENTS

JP    57-33028    2/1982

(Continued)

OTHER PUBLICATIONS

International Search Report issued for International application No. PCT/JP2004/013753 mailed on Dec. 21, 2004 and English translation thereof, 4 pages.

Primary Examiner—Andrew H. Hirshfeld
Assistant Examiner—Timothy J. Dole
(74) Attorney, Agent, or Firm—Osha Liang LLP

(57) ABSTRACT

There is provided a current measuring apparatus for measuring current-under-measurement flowing between a first measuring terminal and a second measuring terminal, having a plurality of primary coils whose one end is electrically connected with the first measuring terminal and another end thereof is electrically connected with the second measuring terminal, a secondary coil that generates voltage representing the current-under-measurement corresponding to the current-under-measurement flowing through the plurality of primary coils and coaxial cables, each corresponding to the plurality of primary coils and having a signal line that connects one end of the primary coil with the first measuring terminal and a shield, and the coaxial cable has the signal line, an insulating layer for coating the signal line, first one of the shield having a tape-like conductor wound around the insulating layer and second one of the shield made of a conductor provided around the first shield.

4 Claims, 12 Drawing Sheets

FOREIGN PATENT DOCUMENTS

| | | |
|---|---|---|
| JP | 58-131523 | 9/1983 |
| JP | 61-70774 | 5/1986 |
| JP | 9-275191 | 10/1997 |
| JP | 9-330621 | 12/1997 |
| JP | 03/008985 | 1/2003 |

* cited by examiner

| ITEM | UNIT | | MEASURED DATA | n NUMBER |
|---|---|---|---|---|
| | | | | WHOLE NUMBER |
| THRESHOLD VOLAGE | AC | V/min. | 300V, OK | n=5 |
| INSURATION RESISTANCE | GΩ·m(DC250V) | | 293.8 | n=5 |
| ELECTROSTATIC CAPACITY | 1kHz | pF/m | 4988 | n=10 |
| CHARACTERISTIC IMPEDANCE (AVERAGE) | TDR | Ω | 2.178 | *1 |
| CHARACTERISTIC IMPEDANCE (ONE) | TDR | Ω | 2.26 | *1 |
| CHARACTERISTIC IMPEDANCE (FIVE) | TDR | Ω | 0.40 | *2 |

FIG. 11

Ch. 1 = 20.00 mVolts/div   Offset = 60.00 mVolts
Timebase = 1.00 ns/div   Impedance = 2.26 Ohms Ch. 1 = 20.00 mVolts/div   Offset = 60.00 mVolts
Timebase = 1.00 ns/div   Impedance = 400 mOhms

CURRENT MEASURING APPARATUS, TEST APPARATUS, AND COAXIAL CABLE AND ASSEMBLED CABLE FOR THE APPARATUSES

CROSS REFERENCE TO RELATED APPLICATION

This is a continuation application of PCT/JP2004/013753 filed on Sep. 21, 2004 which claims priority from a Japanese Patent Application(s) NO. 2003-330732 filed on Sep. 22, 2003, the contents of which are incorporated herein by reference.

BACKGROUND OF THE INVENTION

1. Field of the Invention

The present invention relates to a current measuring apparatus and a test apparatus as well as to a coaxial cable and an assembled cable used for the apparatuses. More specifically, the invention relates to a current measuring apparatus having coils that generate voltage representing current-under-measurement and to a low impedance coaxial cable and an assembled cable used for transmitting the current-under-measurement from a current supply.

2. Related Art

Conventionally, there has been known a current measuring apparatus for measuring electric current based on a magnetic field generated by the current-under-measurement. For example, a current probe measures electric current based on voltage generated in a secondary coil of a transformer corresponding to the current-under-measurement flowing through a primary coil thereof.

In case of measuring source current of an electronic device, a power terminal of the electronic device is connected with a current measuring apparatus by a coaxial cable or the like to input current-under-measurement to the current measuring apparatus. An observation zone is determined by such factors as capacity, inductance and characteristic impedance in such measurement.

Because the capacity of a supply line is unchangeable here, it is desirable to reduce the inductance and the characteristic impedance in order to widen the observation zone. As an example of such low impedance coaxial cable, there has been disclosed one in which a conductive laminate made of aluminum foil and others pasted on a film base material made of polyester or polyimide as its substrate is wound around an outer periphery of a conductor while putting the aluminum foil on the conductor side and an insulation layer is provided further around the outer periphery of the laminate (Japanese Patent No. 1992-56408).

However, it has been difficult to measure the current at high precision by the conventional current probe due to an influence of inductance of the line through which the current-under-measurement flows. Therefore, it has been also difficult to perform IDDT test at high precision in testing an electronic device for example. Still more, because the inductance increases in proportion to a square of a number of turns of the primary coil in the current probe, insertion impedance increases in measuring the current if the number of turns of the primary coil is 2 or more. Therefore, it has been troublesome to provide the current probe in which the number of turns of the primary coil is 2 or more and to measure micro-current at high precision by such current probe.

It has been also known that the closer an outer diameter of a signal line (core line) to an outer diameter of an insulator provided around the signal line, the smaller a value of characteristic impedance of a coaxial cable becomes. Here, the coaxial cable described above is arranged so as to bring an outer diameter of the signal line closer to an outer diameter of the insulator by increasing an effective sectional area and an effective radius of the conductor, i.e., the signal line, by means of a conductive laminator. However, the coaxial cable described above is intended for 50Ω or more of value of characteristic impedance and cut-through resistance is increased by fully increasing a thickness of the surrounding insulator.

Meanwhile, it is necessary to extremely thin the thickness of the insulator to relatively reduce the outer diameter of the insulator in order to realize a coaxial cable whose value of characteristic impedance is several Ω for the purpose of measuring source current of an electronic device. It is then necessary to facilitate uncovering of the insulator by increasing the cut-through resistance and to satisfy threshold voltage of the insulator in the same time in order to realize it.

SUMMARY OF THE INVENTION

Accordingly, it is an object of the invention to provide a current measuring apparatus and a test apparatus as well as to a coaxial cable and an assembled cable used for the apparatuses, capable of solving the above-mentioned problems. This object may be achieved through the combination of features described in independent claims of the invention. Dependent claims thereof specify preferable embodiments of the invention.

That is, according to a first aspect of the invention, there is provided a current measuring apparatus for measuring current-under-measurement flowing between a first measuring terminal and a second measuring terminal, having a primary coil whose one end is electrically connected with the first measuring terminal and another end thereof is electrically connected with the second measuring terminal, a secondary coil that generates voltage representing the current-under-measurement corresponding to the current-under-measurement flowing through the primary coil and a coaxial cable having a signal line that connects one end of the primary coil with the first measuring terminal and a shield, wherein the coaxial cable has the signal line, an insulating layer for coating the signal line, first one of the shield having a tape-like conductor wound around the insulating layer and second one of the shield composed of a conductor provided around the first shield.

The current measuring apparatus may have a plurality of primary coils, the secondary coil that generates the voltage representing the current-under-measurement corresponding to the current-under-measurement flowing through the plurality of primary coils and a plurality of the coaxial cables, each corresponding to each one of the plurality of primary coils, having the signal line for electrically connecting the one end of the corresponding primary coil with the first measuring terminal and the shield.

The current measuring apparatus may further include a resistor for connecting one end and another end of the secondary coil and may output potential of the one end of the secondary coil as a value representing the current-under-measurement.

The current measuring apparatus may further include a core around which the primary coil and the secondary coil are wound, respectively.

According to a second aspect of the invention, there is provided a test apparatus for testing an electronic device, having a pattern generating section for generating an input pattern signal to be inputted to the electronic device, a power supply section for supplying power to the electronic device, a signal inputting section for supplying the input pattern signal to the electronic device, a current measuring section for measuring current-under-measurement flowing between a power terminal of the electronic device and the power supply section and a judging section for judging whether or not the electronic device is defect-free based on a measured result of the current measuring section; the current measuring section has a primary coil whose one end is electrically connected with the power terminal and another end thereof is electrically connected with the power supply section, a secondary coil that generates voltage representing the current-under-measurement corresponding to the current-under-measurement flowing through the primary coil, a coaxial cable having a signal line that electrically connects the one end of the primary coil with the first measuring terminal and a shield; and the coaxial cable has the signal line, an insulating layer for coating the signal line, a first shield having a tape-like conductor wound around the insulating layer and a second shield composed of a conductor provided around the outer periphery of the first shield.

The power supply section may supply operating voltage to be received by the electronic device by its power terminal to another end of the primary coil. The power supply section may earth another end of the primary coil. The current measuring section may measure the current-under-measurement corresponding to changes of a value of the input pattern signal.

The current measuring section may have a plurality of the primary coils, the secondary coil that generates the voltage representing the current-under-measurement corresponding to the current-under-measurement flowing through the plurality of primary coils and a plurality of the coaxial cables, each corresponding to each one of the plurality of primary coils, having the signal line for electrically connecting the one end of the corresponding primary coil with the first measuring terminal and the shield.

The electronic device may have a plurality of power terminal for receiving potential set in advance, each of the power terminals may be electrically connected with one end of either one of the primary coils and the one end of each of the primary coils may be electrically connected with either one of the power terminals.

According to a third aspect of the invention, there is provided a coaxial cable, having a signal line, an insulating layer for coating the signal line, a first shield having a tape-like conductor wound around the insulating layer and a second shield composed of a conductor provided around the outer periphery of the first shield.

A value of characteristic impedance between the signal line and the first shield may be 2.5Ω or less.

The first shield may have a tape-like insulator and a tape-like composite taping member composed of a tape-like conductor containing a first region whose width is wider than the tape-like insulator and which contacts with the tape-like insulator in parallel and a second region that has a width set in advance from one edge of a tape width direction and that does not overlap with the tape-like insulator, and the composite taping member may be wound around the outer periphery of the insulating layer so that at least part of the first region of the tape-like conductor overlaps with at least part of the second region of part of the tape-like conductor fore-wound around the insulating layer, so that the tape-like insulator does not overlap with the tape-like insulator fore-wound around the insulating layer in a radial direction of the coaxial cable and so that the side of the tape-like conductor contacts with the insulating layer.

The tape-like conductor may contain a third region that has a preset width from an edge on the opposite side from an edge where the first region is provided in the tape width direction and that does not overlap with the tape-like insulator, the composite taping member may be wound around the outer periphery of the insulating layer so that at least part of the third region in the tape-like conductor overlaps with the outside of the tape-like insulator fore-wound around the insulating layer and the tape-like conductor may contact with the second shield by at least part of the third region.

According to a fourth aspect of the invention, there is provided an assembled cable having a plurality of coaxial cables having substantially equal length, a fixing member for bundling the plurality of coaxial cables in parallel so as to true up edges of the plurality of coaxial cables in an axial direction, a signal line connector having a plane vertical to the axial direction at each edge of the plurality of coaxial cables and provided with signal line connecting conductors for electrically connecting respective signal lines of the plurality of coaxial cables exposed at the respective edges of the plurality of coaxial cables and a shield connector for electrically connecting respective shields of the plurality of coaxial cables exposed in the vicinity of the respective edges of the plurality of coaxial cables.

It is noted that the summary of the invention described above does not necessarily describe all necessary features of the invention. The invention may also be a sub-combination of the features described above.

BRIEF DESCRIPTION OF THE DRAWINGS

FIG. 6A shows a first wiring pattern, FIG. 6B shows a second wiring pattern and FIG. 6C shows a third wiring pattern, respectively.

FIG. 11 is a table showing actually measured results of characteristics of the coaxial cable 204 of the embodiment in a table format.

FIG. 12A shows the results of actually measured value of characteristic impedances when a number of the coaxial cable 204 is one and FIG. 12B shows the results when the number of coaxial cables 204 is five.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
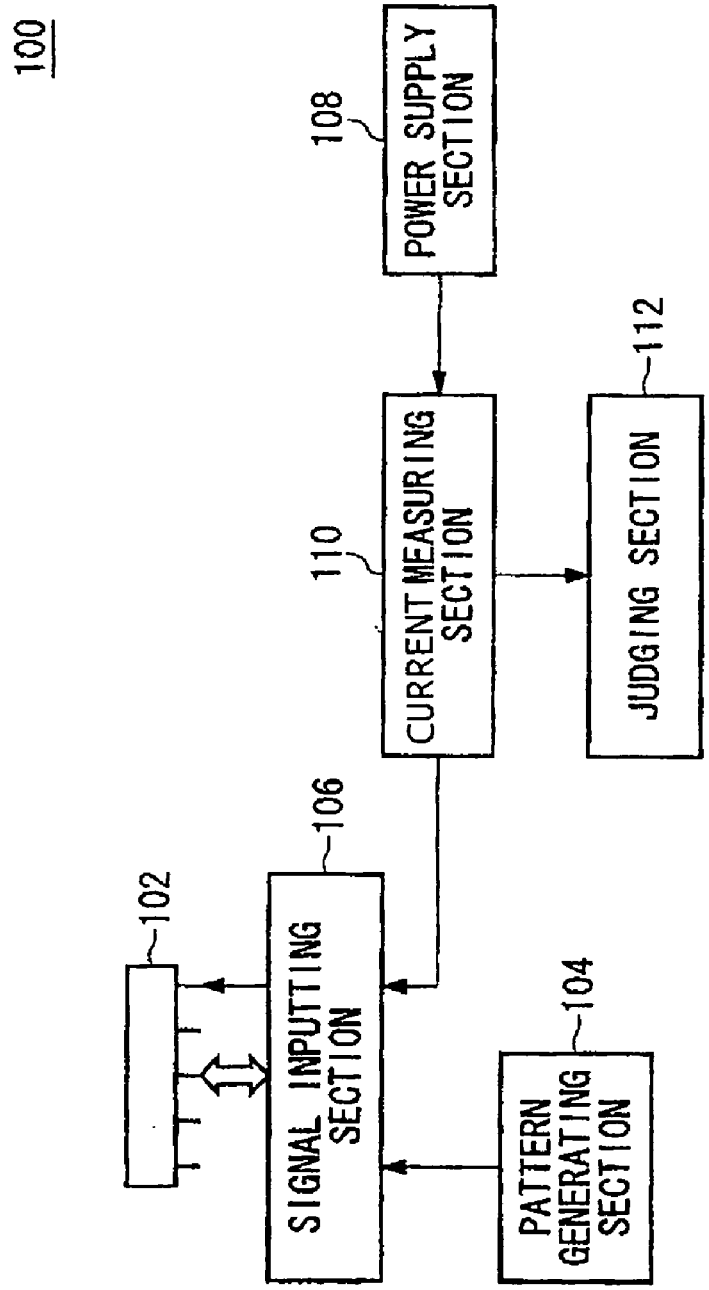
FIG. 1 is a diagram showing one exemplary configuration of a test apparatus 100 according to one embodiment of the invention.

FIG. 1 is a diagram showing one exemplary configuration of a test apparatus 100 according to one embodiment of the invention. In the present embodiment, the test apparatus 100 is a test apparatus for testing an electronic device 102 and has a pattern generating section 104, a power supply section 108, a signal inputting section 106, a current measuring section 110 and a judging section 112.

The pattern generating section 104 generates an input pattern signal to be inputted to the electronic device 102. The power supply section 108 feeds power to the electronic device 102. In the present embodiment, the power supply section 108 feeds the power to the electronic device 102 via the current measuring section 110. The signal inputting section 106 feeds the input pattern signal to the electronic device 102. The electronic device 102 may be provided in a test head for example.

The current measuring section 110 measures current-under-measurement flowing between a power terminal of the electronic device 102 and the power supply section 108. In the present embodiment, the current measuring section 110 measures the current-under-measurement corresponding to changes of the value of the input pattern signal. The current measuring section 110 may measure transition of IDD current corresponding to the changes of the input pattern signal. The power supply section 108 feeds the operating voltage VDD to a VDD power terminal of the electronic device 102 in the present embodiment. The test apparatus 100 may perform an IDDT test on the electronic device 102. Still more, the current measuring section 110 may measure changes of ground current corresponding to the changes of the input pattern signal. In this case, the power supply section 108 earths a VSS power terminal of the electronic device 102. The current measuring section 110 judges whether or not the electronic device 102 is defect-free based on the measured result of the current measuring section 110. In the present embodiment, the judging section 112 judges that the electronic device 102 is defective when the measured result is greater than a value set in advance.

Here, the electronic device refers to a parts that conducts a predetermined action corresponding to given current or voltage and includes semiconductor parts composed of an active element such as an IC (Integrated Circuit) and an LSI (Large-Scale Integrated circuit). Still more, these parts may be what provided on a wafer, may be parts combined and stored in one package or may be what mounted on a printed board to realize a predetermined function such as a bread board.

Figure 2:
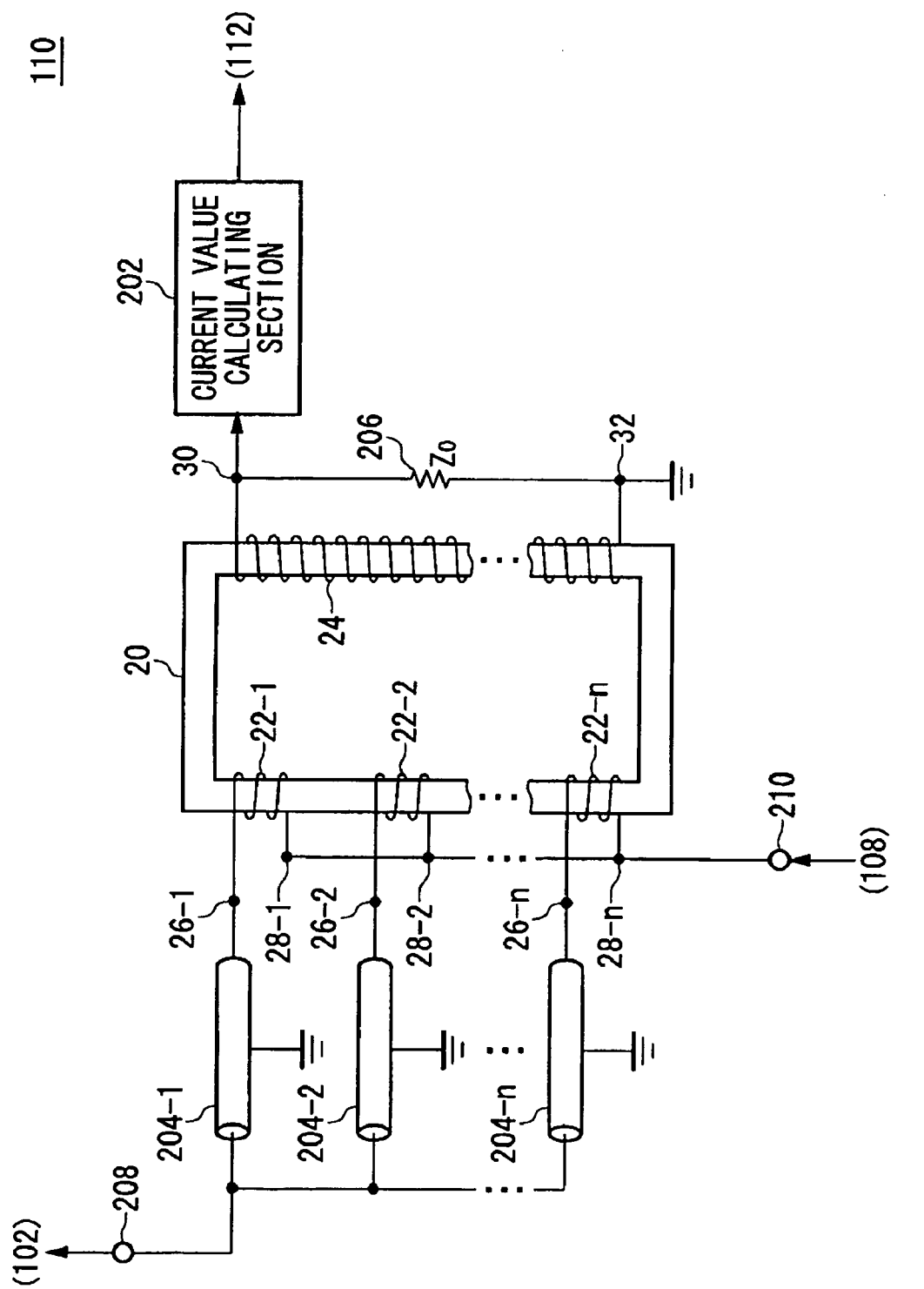
FIG. 2 is a diagram showing one exemplary configuration of a current measuring section 110 of the embodiment.

FIG. 2 is a diagram showing one exemplary configuration of the current measuring section 110 of the embodiment. The current measuring section 110 has a plurality of primary coils 22, a plurality of coaxial cables 204, a first measuring terminal 208, a second measuring terminal 210, a resistor 206, a secondary coil 24, a core 20 and a current value calculating section 202. In the present embodiment, the current measuring section 110 has n primary coils 22-1 through 22-n (n is a positive integer set in advance) and n coaxial cables 204-1 through 204-n. The current measuring section 110 may measure the current-under-measurement flowing between the first measuring terminal 208 and the second measuring terminal 210.

One end of the plurality of primary coils 22-1 through 22-n is electrically connected with the first measuring terminal 208 and another end thereof is electrically connected with the second measuring terminal 210. For example, a terminal 26-k that is one end of the primary coil 22-k (k is an integer satisfying $1 \leq k \leq n$) is electrically connected with the first measuring terminal 208. Still more, a terminal 28-k that is another end of the primary coil 22-k is electrically connected with the second measuring terminal 210.

Each of the plurality of coaxial cables 204-1 through 204n corresponds to each of the plurality of primary coils 22-1 through 22-n. Each of the plurality of coaxial cables 204-1 through 204n has a signal line that electrically connects one end of the corresponding primary coil 22 with the first measuring terminal 208 and a shield. Preferably, the shield is earthed. Instead of that, the shield may be connected with a power supply that outputs voltage set in advance and may be connected also with a VDD power supply that supplies operating voltage VDD of the electronic device 102 for example. The shield may be also connected with the second measuring terminal 210. In the present embodiment, the signal line of the coaxial cable 204-k electrically connects the terminal 26-k that is one end of the primary coil 22-k with the first measuring terminal 208. Preferably, the plurality of coaxial cables 204-1 through 204n has almost equal impedance characteristics, respectively.

The first measuring terminal 208 is electrically connected with the power terminal of the electronic device 102 explained in connection with FIG. 1. Still more, the second measuring terminal 210 is electrically connected with the power supply section 108 explained in connection with FIG. 1. That is, the terminal 26-k is electrically connected with the power terminal and the terminal 28-k is electrically connected with the power supply section 108.

In the present embodiment, the terminal 26-k is electrically connected with the VDD power terminal of the electronic device 102. The power supply section 108 feeds the operating voltage VDD, to be received by the electronic device 102 by the VDD power terminal, to the terminal 28-k. According to another embodiment, the terminal 26-k may be electrically connected with a VSS power terminal of the electronic device 102. In this case, the power supply section 108 earths the terminal 28-k.

The resistor 206 electrically connects a terminal 30, i.e., one end of the secondary coil 24, with a terminal 32, i.e., another end thereof. In the present embodiment, the resistor 206 has impedance Z0 set in advance. The secondary coil 24 generates voltage representing the current-under-measurement corresponding to the current-under-measurement flowing through the plurality of primary coils 22-1 through 22-n. The terminal 32 of the secondary coil 24 is earthed. In the present embodiment, the secondary coil 24 supplies potential of the terminal 30, i.e., the voltage representing the current-under-measurement, to the current value calculating section 202.

The core 20 is wound by the plurality of primary coils 22-1 through 22-n and the secondary coil 24, respectively. The core 20 is preferable to be a ferromagnetic core. The core 20 may be a ferrite core for example.

In the present embodiment, the core 20 is formed in the shape of a ring. That is, the core 20 is shaped like the ring having approximately rectangular outer and inner peripheries, in which the plurality of primary coils 22-1 through 22-n is wound around one long side of the rectangle and the secondary coil 24 is wound around the other long side. According to another embodiment, the core 20 may be what the secondary coil 24 is wound in lamination around the plurality of primary coils 22-1 through 22-n.

The core 20 may be also a super-saturated core. It prevents the potential of the terminal 30 from excessively increasing as the core 20 saturates when a value of the current-under-measurement exceeds a current value set in advance. It then enables the current measuring section 110 to efficiently measure the micro current-under-measurement.

The current value calculating section 202 calculates a value representing the current-under-measurement based on the potential of the terminal 30. The current measuring section 110 sends this value to the judging section 112 explained in connection with FIG. 1. The current measuring section 110 may output the potential of the terminal 30 as the value representing the current-under-measurement.

In the present embodiment, the plurality of coaxial cables 204-1 through 204n connects the power terminal of the electronic device 102 with the plurality of primary coils 22-1 through 22-n in parallel. Therefore, the present embodiment allows the influence of the characteristic impedance held by each of the plurality of coaxial cables 204-1 through 204n to be reduced.

This parallel connection also reduces insertion impedance that is an effect of the resistor 206 on the current-under-measurement of impedance Z0. Therefore, a number of turns of the primary coil 22 may be two or more in the present embodiment. In this case, the current measuring section 110 can amplify the current-under-measurement with high amplification factor. Thereby, the current measuring section 110 can measure the micro current at high precision. Still more, the present embodiment allows wiring parasitic inductance to be reduced by connecting the power terminal of the electronic device 102 with the primary coil 22 via the coaxial cables 204.

Figure 3:
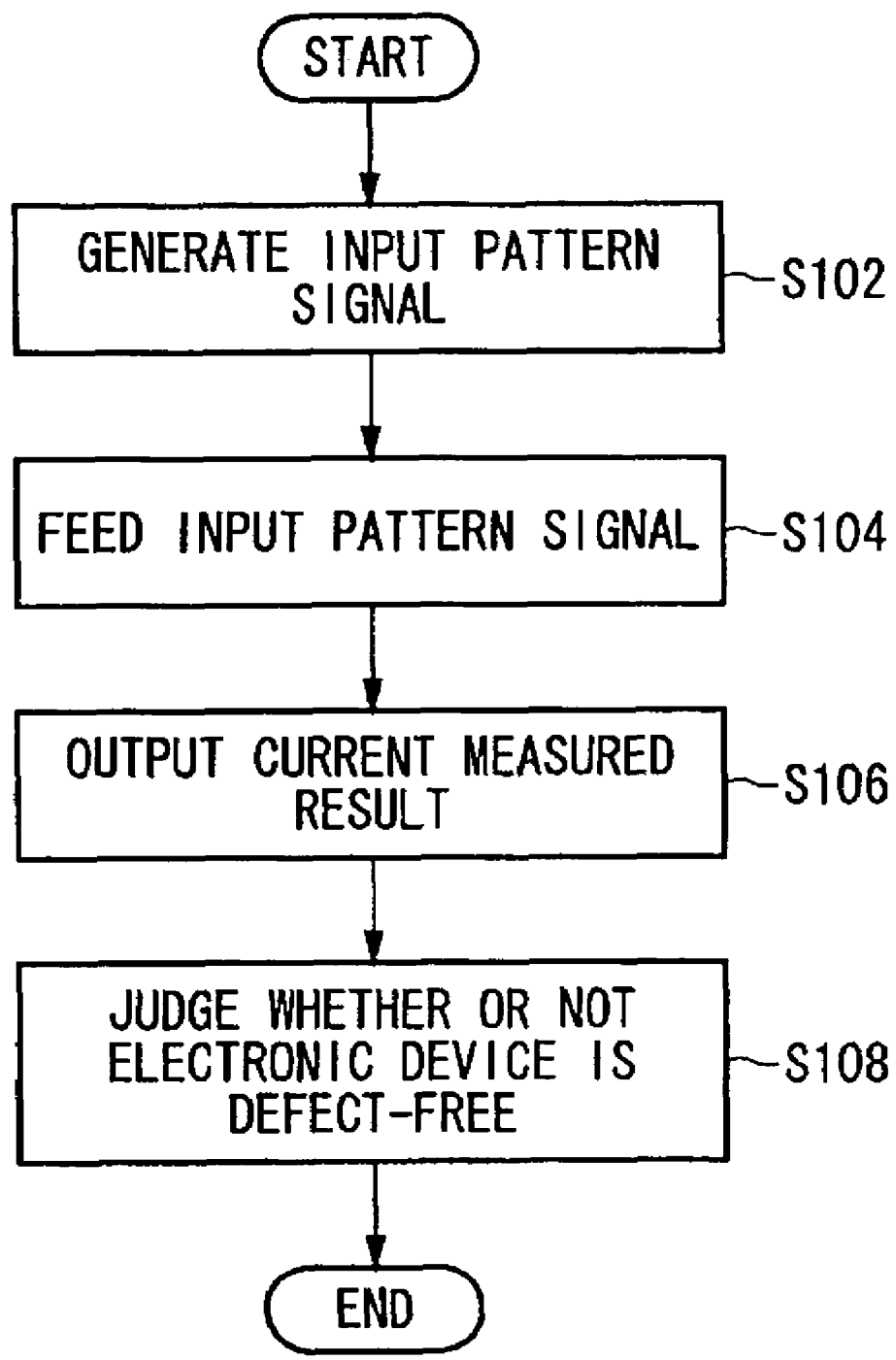
FIG. 3 is a flowchart showing one exemplary testing method of the embodiment.

FIG. 3 is a flowchart showing one exemplary testing method performed by the test apparatus 100 explained in connection with FIG. 1. This test method is what performed to test the electronic device.

According to the present embodiment, the test apparatus 100 generates the input pattern signal to be inputted to the electronic device 102 explained in connection with FIG. 1 in a pattern generating step S102 at first. The pattern generating step S102 may be carried out by means of the pattern generating section 104 explained in connection with FIG. 1. Next, the input pattern signal is sent to the electronic device 102 in a signal inputting step S104. The signal inputting step S104 may be carried out by means of the signal inputting section 106 explained in connection with FIG. 1.

Next, the voltage representing the current-under-measurement generated in the secondary coil 24 explained in connection with FIG. 2 is outputted as a measured result representing the current-under-measurement in a current measuring step S106. The secondary coil 24 generates this voltage based on the current-under-measurement flowing through the plurality of primary coils 22-1 through 22-n explained in connection with FIG. 1. In the present embodiment, the power supply section 108 explained in connection with FIG. 1 feeds the current-under-measurement to the electronic device 102. The current measuring step S106 may be carried out by means of the current measuring section 110 explained in connection with FIG. 1.

Next, it is judged whether or not the electronic device 102 is defect-free in a judging step S108 based on the measured result in the current measuring step S106. In the present embodiment, the test apparatus 100 judges that the electronic device 102 is defective when the current value represented by the measured result is greater than the value set in advance in the judging step S108. The judging step S108 may be carried out by means of the judging section 112 explained in connection with FIG. 1. The test apparatus 100 may end the operation after ending the judging step S108.

Figure 4:
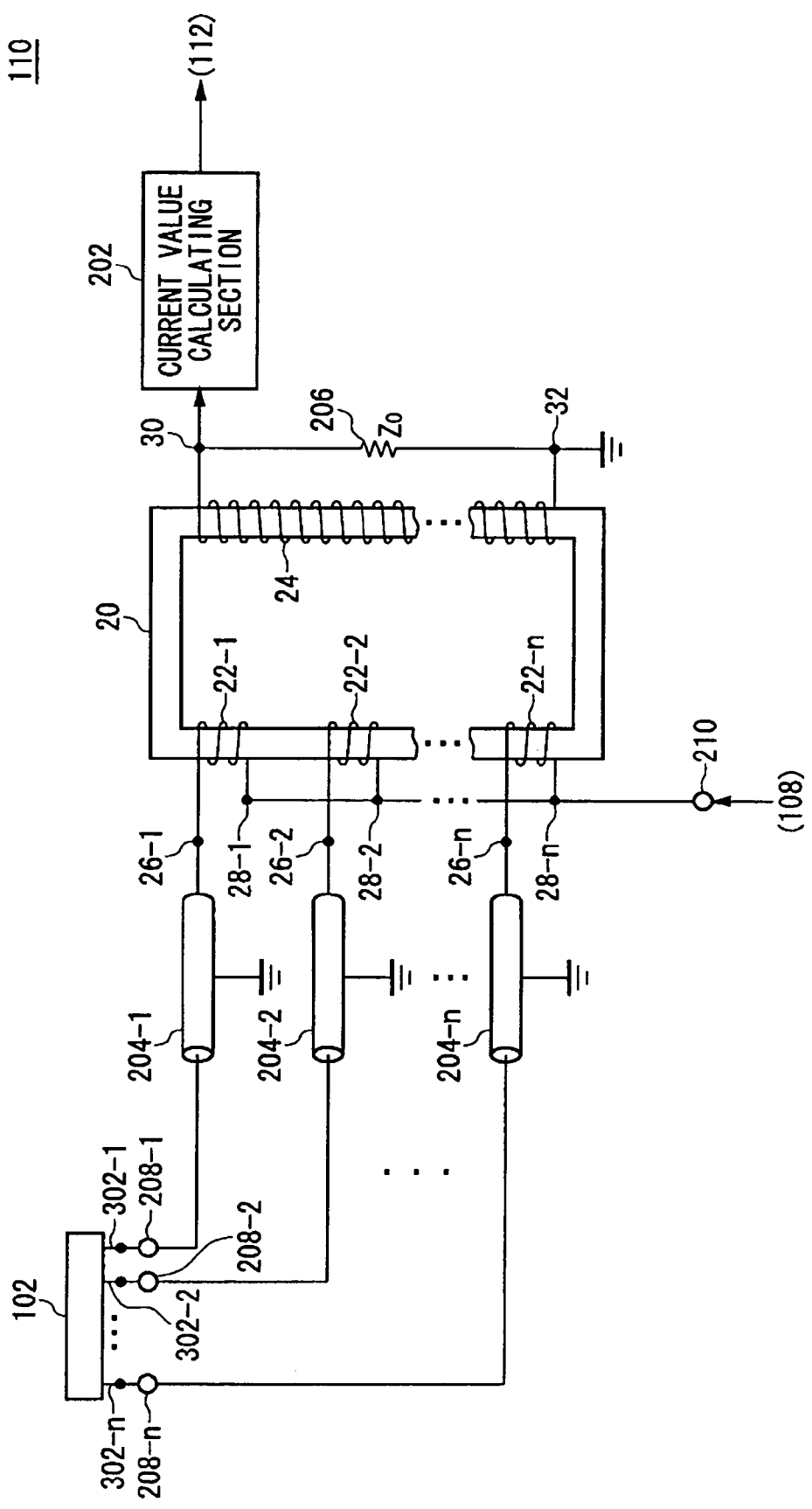
FIG. 4 is a diagram showing another exemplary configuration of the current measuring section 110 of the embodiment.

FIG. 4 is a diagram showing another exemplary configuration of the current measuring section 110 of the embodiment. In this example, the electronic device 102 is provided with a plurality of power terminals that receives potential set in advance. Each of the power terminals is electrically connected with one end of either one primary coil and one end of each primary coil is electrically connected with either one power terminal.

In this example, the electronic device 102 has n VDD power terminals 302-1 through 302-n. The current measuring section 110 has n first measuring terminals 208-1 through 208-n. The first measuring terminal 208-k is electrically connected with the VDD power terminal 302-k. The coaxial cable 204-k electrically connects the first measuring terminal 208-k with the terminal 26-k of the primary coil 22-k.

The present embodiment allows the current flowing between the plurality of VDD power terminals 302-1 through 302-n of the electronic device 102 and the power supply section 108 explained in connection with FIG. 1 to be measured. In another embodiment, the electronic device 102 may have more VDD power terminals. In this case, one first measuring terminal 208 is electrically connected with the plurality of VDD power terminals 302. According to a still other embodiment, one VDD power terminal 302 may be electrically connected with a plurality of first measuring terminals 208. The electronic device 102 may have a plurality of VSS power terminals as the power terminals to be connected with the current measuring section 110.

The plurality of terminals 26 may be electrically connected from each other in the current measuring section 110 shown in FIGS. 2 and 4. Still more, instead of the plurality of primary coils 22 and the plurality of coaxial cables 204, the current measuring section 110 may have one primary coil 22 and one coaxial cable 204 connected with the primary coil 22. Or, the current measuring section 110 may have one primary coil 22 and a plurality of coaxial cables 204 connected with the primary coil 22. In this case, each of the signal line of the plurality of coaxial cables 204 may electrically connect the terminal 26 of the primary coil 22 with the first measuring terminal 208 common to the plurality of coaxial cables 204 or instead of that, may electrically connect the terminal 26 of the primary coil 22 with the first measuring terminal 208 that is different from each other among the plurality of first measuring terminals 208.

Figure 5:
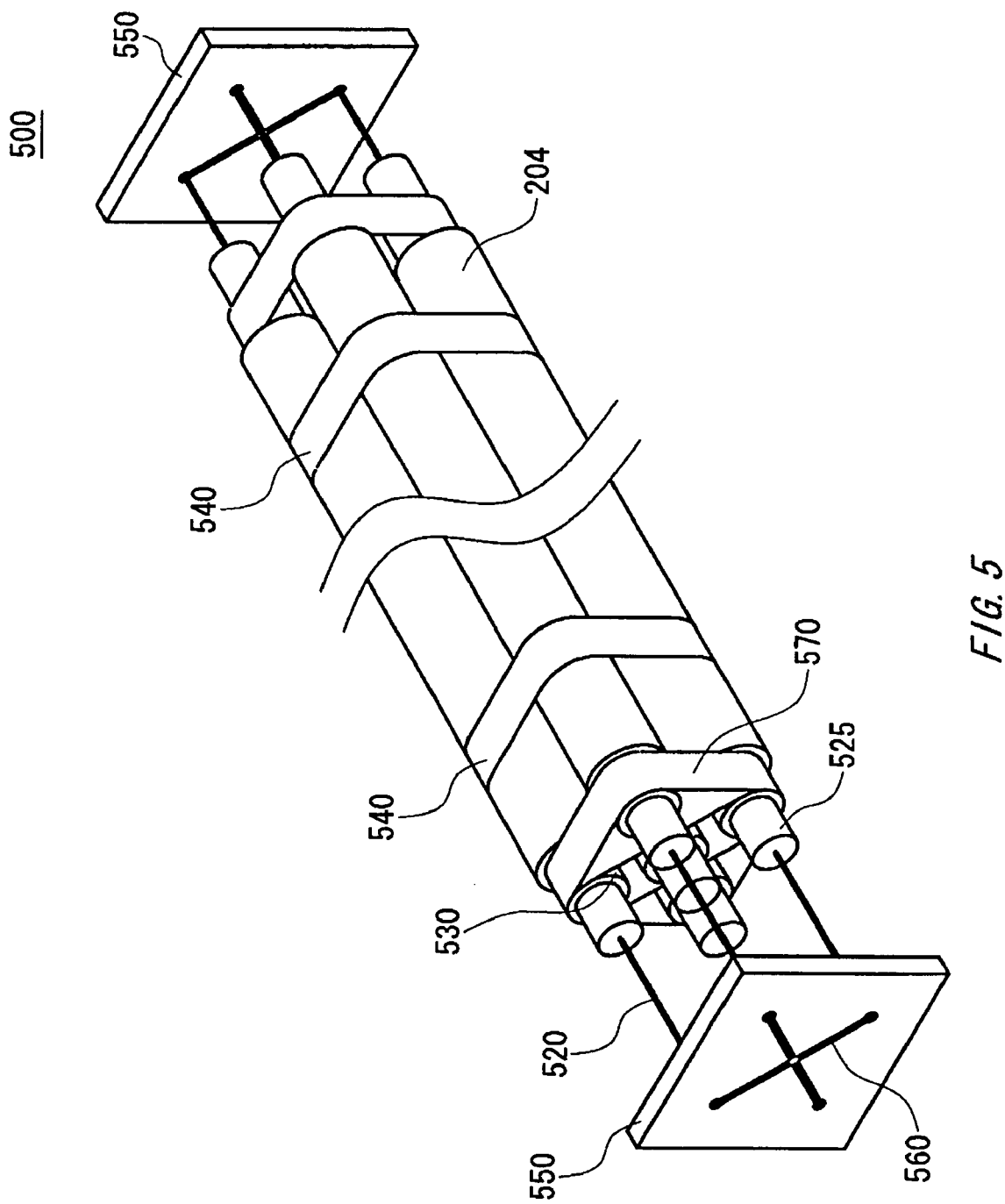
FIG. 5 is a drawing showing a structure of an assembled cable 500 of the embodiment.

FIG. 5 is a drawing showing a structure of an assembled cable 500 of the embodiment. The assembled cable 500 of the present embodiment is designed to reduce a value of characteristic impedance of the entire assembled cable 500 to what a value of characteristic impedance of the coaxial cable is divided by a number of the coaxial cables by arranging the plurality of coaxial cables 204 in proximity and in parallel.

The assembled cable 500 has the plurality of coaxial cables 204, a fixing member 540, a signal line connector 550 and a shield connector 570. Each of the plurality of coaxial cables 204 corresponds to either one of the coaxial cables 204-1 through 204-n shown in FIG. 2 or 4. The plurality of coaxial cables 204 has substantially equal length such as 500 mm and is used in a state in which the signal line 520, i.e., an internal conductor, is exposed by 3 mm, the insulating layer 525 by 0.8 mm and the shield 530, i.e., an external conductor, by 1.0 mm at both ends of each coaxial cable 204. Here, each coaxial cable 204 is arranged so as to suppress the value of characteristic impedance thereof to several Ω or less, or more preferably to 2.5Ω, in order to suppress the value of characteristic impedance of the assembled cable 500 to 1.0Ω or less, or more preferably to 0.5Ω or less. The fixing member 540 bundles the plurality of coaxial cables 204 in parallel so that each end of the plurality of coaxial cables 204 is aligned in an axial direction and fixes the plurality of coaxial cables 204 while arranging in parallel. More specifically, the fixing member 540 may be made of an adhesive tape and may fix the plurality of coaxial cables 204 in the neighborhood of the both ends of the plurality of coaxial cables 204. Instead of that, the fixing member 540 may be made of a plastic tape and may fix the outer periphery of the plurality of coaxial cables 204 by melting. Or, the fixing member 540 may be made of a heat shrink tube and may fix the plurality of coaxial cables 204 by thermal shrinkage.

The signal line connector 550 has a plane vertical to the axial direction at each end of the plurality of coaxial cables 204. The signal line connector 550 is provided with the signal line connecting conductor 560 for electrically connecting each signal line 520 exposed at each end of the plurality of coaxial cables 204 and electrically conducts the plurality of signal lines 520 while disposing them in parallel. The signal line connector 550 may be a printed board provided vertically with respect to the axial direction of the coaxial cable 204 for example. In this case, the signal line connector 550 may have a structure of having a plurality of through holes into which the signal lines 520 of the coaxial cables 204 are inserted and of connecting the plurality of through holes from each other by the signal line connecting conductors 560. Or instead of that, the signal line connector 550 may be a metallic belt molded by a die to realize as a plug whose whole plane functions as the signal line connecting conductor 560.

The use of the signal line connector 550 and the electrical connection of the respective signal lines 520 of the plurality of coaxial cables 204 allow the plurality of signal lines 520 to be connected from each other while equally keeping the length of the exposed signal lines 520 and insulating layers 525, inductance, characteristic impedance and others.

The shield connector 570 electrically connects each shield 530 exposed in the vicinity of each end of the plurality of coaxial cables 204. The shield connector 570 may be copper foil of 1.0 mm in width and 20 μm in thickness for example.

The assembled cable 500 described above allows the value of characteristic impedance of the entire assembled cable 500 to be reduced to what the value of characteristic impedance of the coaxial cable is divided by the number of coaxial cables by arranging the plurality of coaxial cables 204 in parallel. That is, when five coaxial cables 204 are arranged in parallel and the value of characteristic impedance of each coaxial cable 204 is 2Ω for example, the value of characteristic impedance of the assembled cable 500 may be reduced to 0.4Ω. Still more, the use of the fixing member 540, the signal line connector 550 and the shield connector 570 allows the plurality of coaxial cables 204 to be bundled in a body while equally keeping the length and other thereof and allows the assembled cable 500 to be readily drawn around while suppressing dispersion of characteristics caused in each coaxial cable 204 to the minimum.

Figure 6A:
FIGS. 6A through 6C are drawings showing exemplary wiring patterns of a signal line connecting conductor 560 of the embodiment.
Figure 6B:
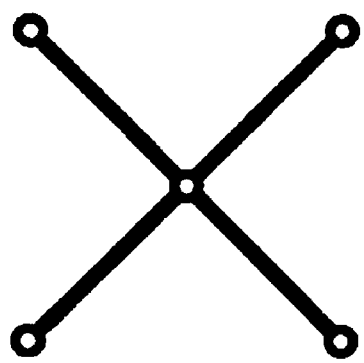
Figure 6C:
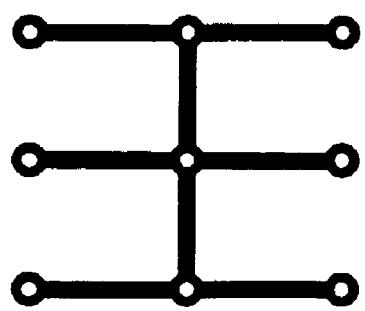

FIGS. 6A through 6C are drawings showing exemplary wiring patterns of the signal line connecting conductor 560 of the embodiment. FIG. 6A shows a first wiring pattern. The first wiring pattern is provided on the signal line connector 550 to electrically connect the plurality of, e.g., five, signal lines 520 arranged in a row in the assembled cable 500 in which the plurality of coaxial cables 204 are arrayed in a row. The first wiring pattern is suitable for realizing the assembled cable 500 that can be readily bent in a direction vertical to the direction in which the coaxial cables 204 are arrayed.

In this case, the shield connector 570 connects the respective shields 530 of the plurality of coaxial cables 204 by wrapping them.

FIG. 6B shows a second wiring pattern. The second wiring pattern is provided on the signal line connector 550 to electrically connect the respective signal lines 520 while arraying the plurality of, e.g., five, coaxial cables 204 so that a section area occupied by the assembled cable 500 is minimized. In the second wiring pattern, wires are provided between a through hole into which the signal line 520 of the coaxial cable 204 disposed at the center is inserted and through holes into which the signal lines 520 of the respective coaxial cables 204 disposed around that are inserted, respectively.

In this case, the shield connector 570 connects the shields 530 of the coaxial cables 204 arrayed in a diagonal direction by wrapping them and then by wrapping around the outer periphery of the respective shields 530 of the entire coaxial cables 204.

FIG. 6C shows a third wiring pattern. The third wiring pattern is provided to electrically connect respective signal lines 520 in a state in which a large number of, e.g., nine, coaxial cables 204 are arrayed in grid. Then, wires for electrically connecting through holes into which two or more signal lines 520 arrayed in each row in a row direction and wires for electrically connecting through holes into which two or more signal lines 520 arrayed at least in one column in a column direction are provided in the third wiring pattern.

In this case, the shield connector 570 connects the respective shields 530 of the coaxial cables 204 arrayed in the center column direction by wrapping them at first and then by wrapping the outer periphery of the respective shields 530 of the entire coaxial cables 204.

Figure 7:
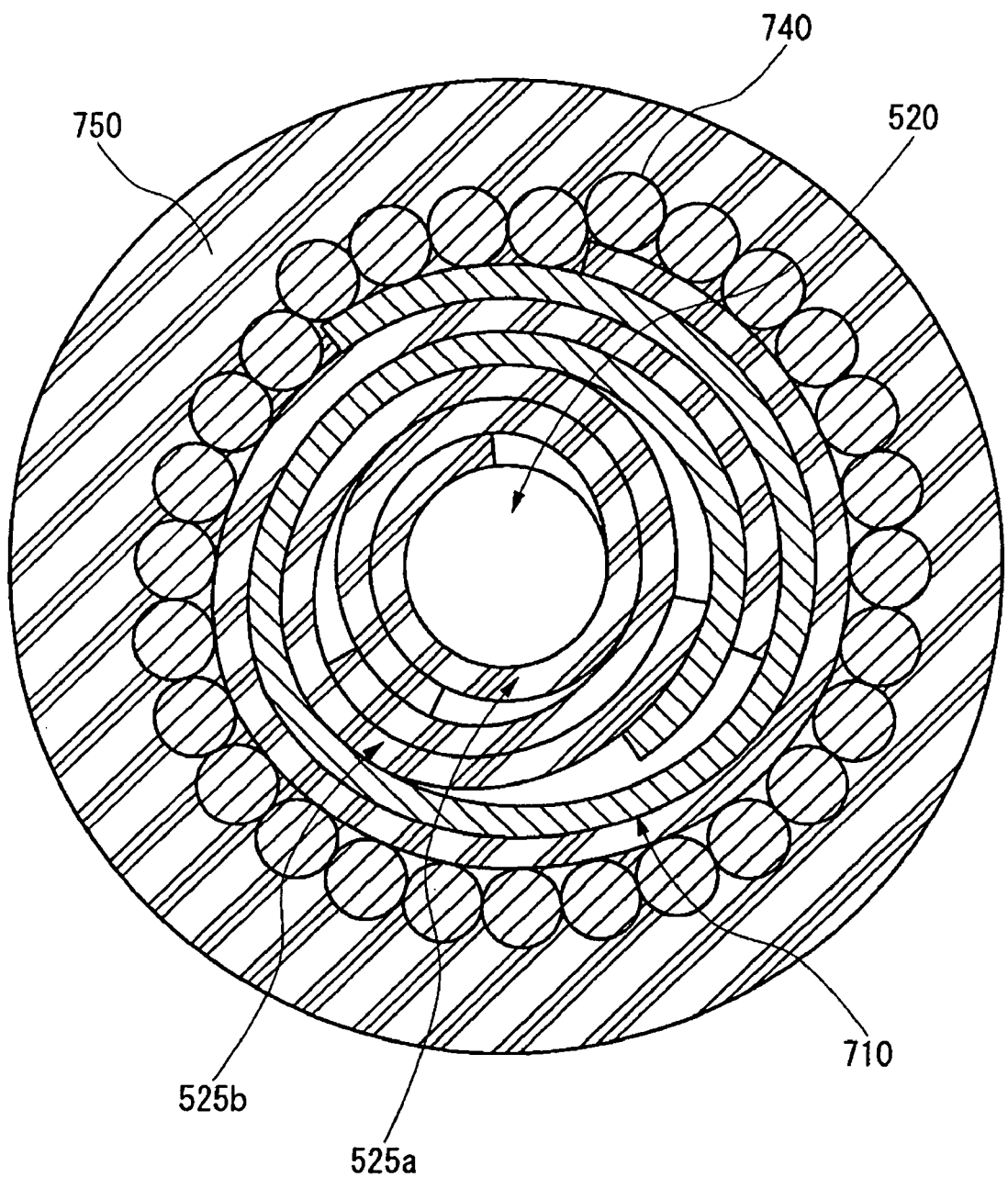
FIG. 7 is a section view of a coaxial cable 204 of the embodiment seen from a direction vertical to an axial direction thereof.
Figure 8:
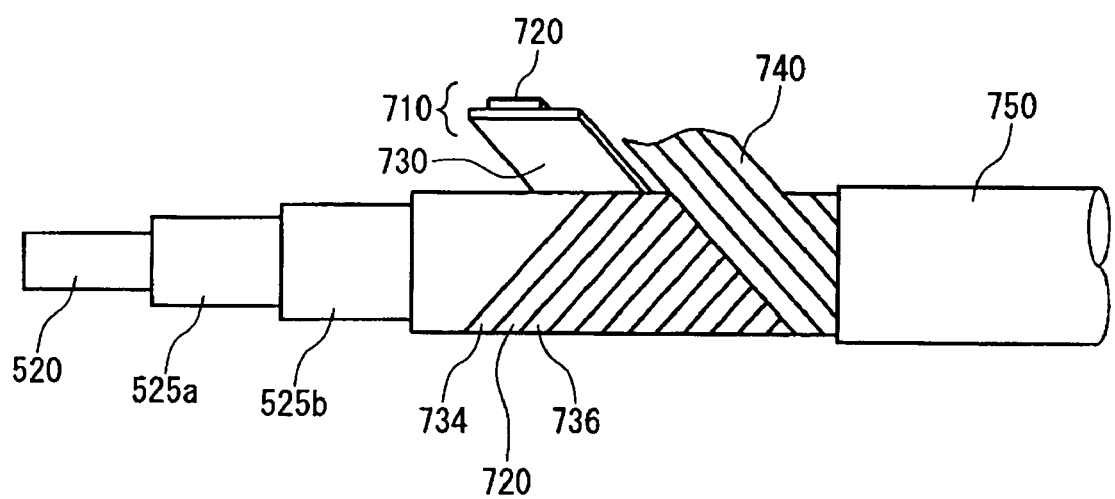
FIG. 8 is a drawing showing a structure of the coaxial cable 204 of the embodiment.
Figure 9:
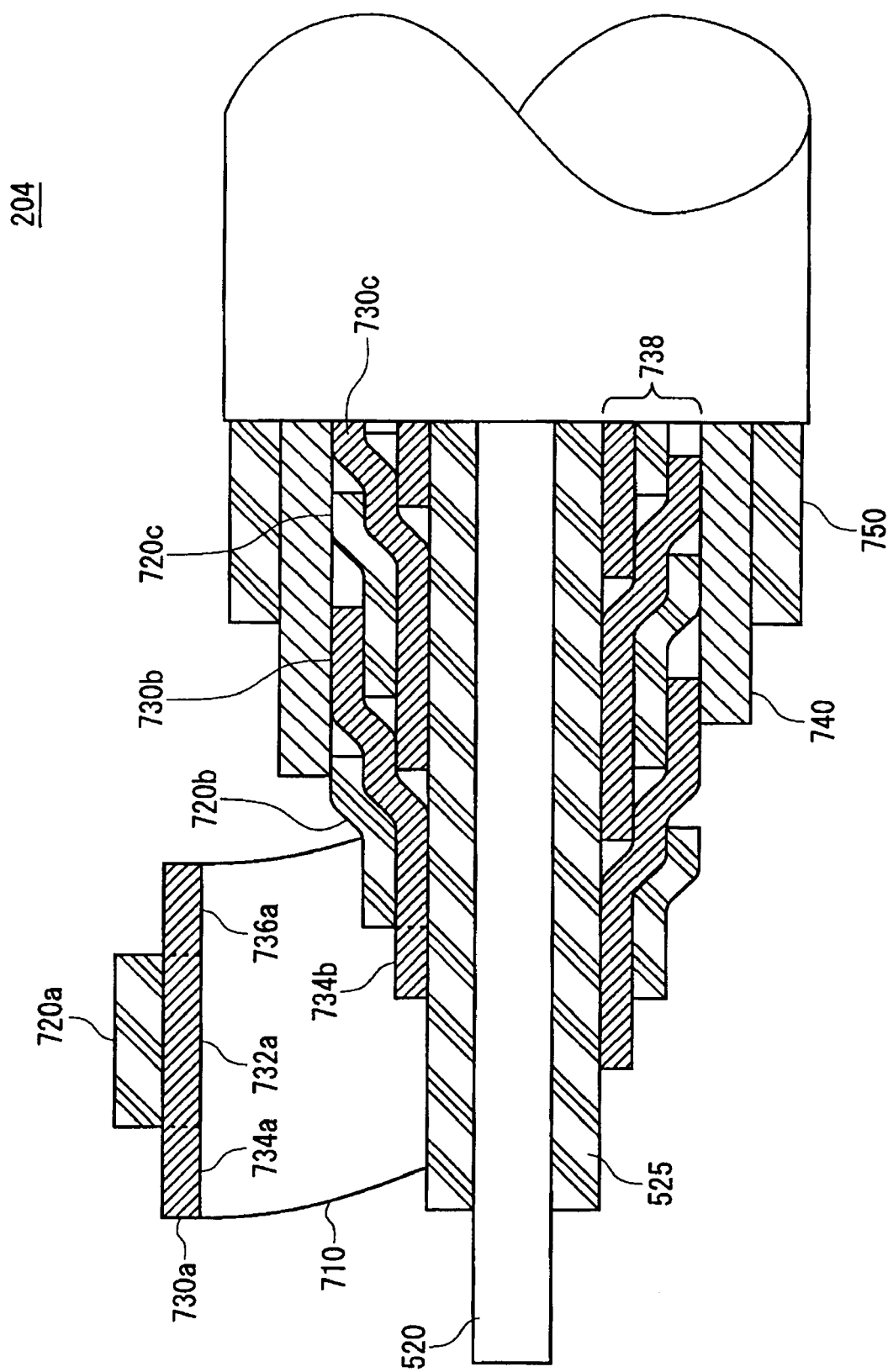
FIG. 9 is a section view of the coaxial cable 204 of the embodiment in an axial section.

FIG. 7 is a section view of the coaxial cable 204 of the embodiment seen from a direction vertical to the axial direction thereof. FIG. 8 is a drawing showing a structure of the coaxial cable 204 of the embodiment. FIG. 9 is a section view of the coaxial cable 204 of the embodiment seen in the axial section thereof. The coaxial cable 204 has the signal line 520, an insulating layer 525 that coats the signal line 520, a first shield 738 having a tape-like composite taping member 710 wound around the outer periphery of the insulating layer 525, a second shield 740 composed of a conductor provided around the outer periphery of the first shield 738 and a sheath 750 provided around the outer periphery of the second shield 740.

The signal line 520 is a conductor such as tinned soft copper wire of 0.52 mm for example. The insulating layer 525 has a tape-like insulator, or more specifically, a tape-like plastic member, wound around the signal line 520. That is, the insulating layer 525 includes a first insulating layer 525a in which a polyester naphthalate (PEN) tape having 1.2 μm of thickness and 3.5 of dielectric constant is wound around the signal line 520 so as to overlap by half. The insulating layer 525 may also include a second insulating layer 525b in which an adhesive tape-like plastic member such as a PEN tape having 1.2 μm of thickness, hot-melt bond and 3.5 of dielectric constant is wound around the outer periphery of the first insulating layer 525a so as to overlap by half while putting the adhesive layer on the inside.

In this case, the first insulating layer 525a is uniformly wound around the conductor and the second insulating layer 525b has the structure in which the tape-like insulator having the adhesive layer is wound around the first insulating layer 525a, so that winding tightening force is enhanced. Therefore, it allows the uniform and very thin insulator having no dispersion of thickness and outer diameter to be realized because the tape-like insulator is hardly loosened after it is wound and no irregularity of the outer diameter is caused due to the looseness. As a result, the coaxial cable 204 can stably keep the value of characteristic impedance as low as 2Ω for example.

The composite taping member 710 is made of the tape-like insulator 720 laminated with the conductor 730. The insulator 720 may be a PET tape or the like of 2.5 mm in width and 2.5 μm in thickness for example. The conductor 730 may be a copper foil tape for example whose width is wider than that of the insulator 720, e.g., 3.0 mm, and whose thickness is 9 μm.

The composite taping member 710 of the embodiment is laminated so that the insulator 720 is positioned approximately at the center in a width direction of the conductor 730 and is wound around the outer periphery of the insulating layer 525 while putting the conductor 730 on the inside and overlapping by half. More specifically, the conductor 730 has a first region 732 whose width is wider than the insulator 720 and which contacts with the insulator 720 in parallel, a second region 734 which has a preset width from one edge in the tape width direction and which does not overlap with the insulator 720 and a third region 736 which has a preset width from another edge on the opposite side of an edge where the first region 732 is provided and which does not overlap with the insulator 720. Then, the composite taping member 710 is wound around the outer periphery of the insulating layer 525 so that at least a part of the first region 732 of the conductor 730 overlaps with at least a part of the second region 734 that is a part of the conductor 730 fore-wound around the insulating layer 525, so that the insulator 720 does not overlap with part of the insulator 720 fore-wound around the insulating layer 525 in the radial direction of the coaxial cable 204 and so that the conductor 730 contacts with the insulating layer 525. The composite taping member 710 may be also wound around the outer periphery of the insulating layer 525 so that at least part of the third region 736 of the conductor 730 overlaps with the outside of the insulator 720 fore-wound around the insulating layer 525.

In FIG. 9 for example, the composite taping member 710 is wound around the outer periphery of the insulating layer 525 so that at least part of the first region 732a overlaps with at least part of the second region 734b that is a part fore-wound around the insulating layer 525, so that the insulator 720a does not overlap with the insulator 720b fore-wound around the insulating layer 525 in the radial direction of the coaxial cable 204 and so that at least part of the third region 736a overlaps with the outside of the insulator 720b fore-wound around the insulating layer 525. Then, because at least part of the conductor 730 is exposed to an outer face of the first shield 738, it contacts with the second shield 740 at least at part of the third region 736. As a result, the conductor 730 and the second shield 740 function in a body as a shield line and the outer diameter of the insulator part of the coaxial cable 204 may be substantially assumed as the outer diameter of the insulating layer 525. Accordingly, the outer diameter of the signal line 520 may be brought substantially closer to the outer diameter of the insulator part and then the characteristic impedance may be reduced.

The composite taping member 710 is composed of the copper foil of about 9.0 sum in thickness and the PET of about 2.5 μm in thickness for example as described above so that it withstands tension in winding around the insulating layer 525 and so as to thin as much as possible. As a result, it becomes possible to suppress the composite taping member 710 from being elongated or cut off and to prevent wrinkles and gaps from being generated in winding the composite taping member 710 around the insulating layer 525. Then, because the first region 732 is wound around the second region 734 that has been fore-wound as a result, the first shield 738 may closely adhere with the insulating layer 525 and a cylindrical shield layer composed of the conductor 730 may be formed at the part in contact with the insulating layer 525. Still more, because the composite taping member 710 formed as described above can maintain high cut-through resistance, the insulator may be readily peeled off.

The second shield 740 is formed by a plurality of conductive lines wound around the outer periphery of the first shield 738 at preset winding intervals for example. That is, the second shield 740 is made of 35 tinned soft copper lines of 0.05 mm wound in spiral at 4.5 mm of winding intervals for example. The sheath 750 is formed as an extrusion layer of FEP resin of 100 μm in thickness for example. Based on the dimensions exemplified above, the outer diameter of the coaxial cable 204 is 0.88 mm.

Thus, the coaxial cable 204 described above realizes the transmission path whose characteristic impedance is low, whose dispersion of characteristics is small and whose cut-through resistance is high by forming the insulating layer 525 by the very thin tape-like plastic member and by forming the first shield 738 by the composite taping member 710 having the tape-like insulator 720 and the conductor 730.

Figure 10:
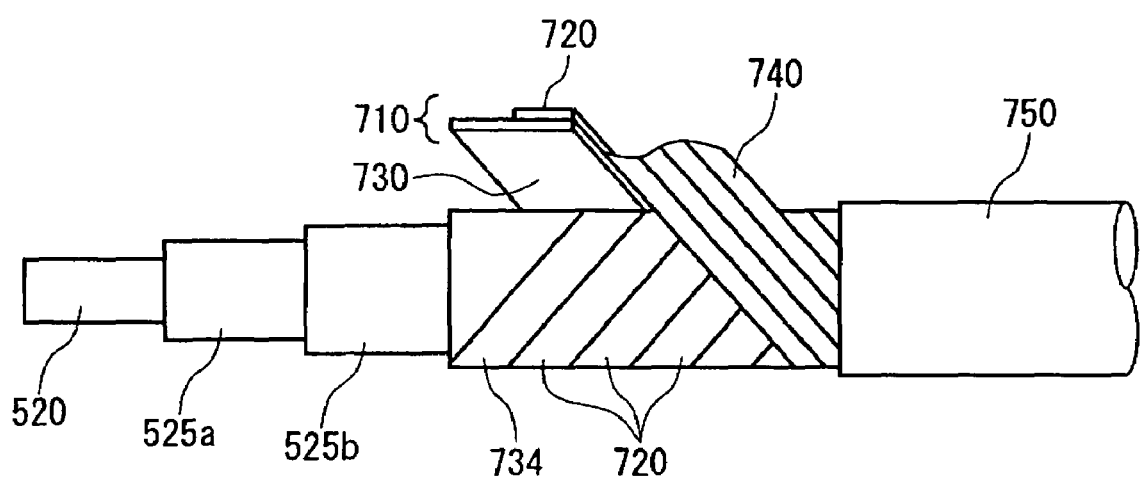
FIG. 10 is a drawing showing another exemplary structure of the coaxial cable 204 of the embodiment.

FIG. 10 is a drawing showing another exemplary structure of the coaxial cable 204 of the embodiment. The coaxial cable 204 shown in FIG. 10 has the same structure with the composite taping member 710 within the coaxial cable 204 shown in FIGS. 7 through 9, except of a point that it has no third region 736, so that its explanation will be omitted here except of the difference. The composite taping member 710 of this example is laminated so that the insulator 720 contacts with one edge of the conductor 730 in the tape width direction.

FIG. 11 is a table showing actually measured results of the characteristics of the coaxial cable 204 in a table formant based on the dimensions exemplified above. In a test of threshold voltage, AC voltage 300 V was applied for 60 seconds between the signal line 520 and the first and second shields 738 and 740 to test whether or not they withstand that. In a test of insulation resistance, the value of insulation resistance was measured after charging for one minute by applying DC voltage 250V between the signal line 520 and the first and second shields 738 and 740.

Figure 12A:
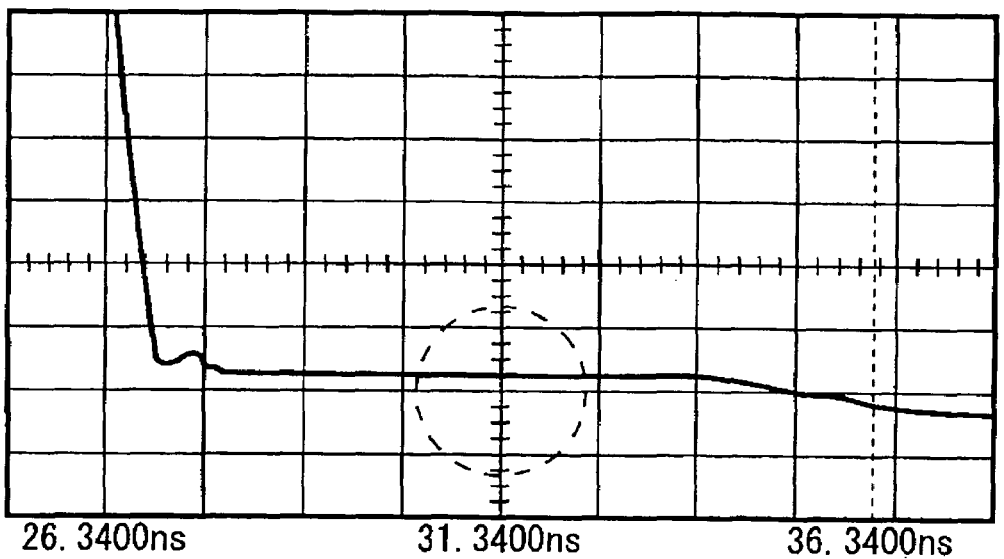
FIGS. 12A and 12B are graphs showing results of actually measured value of characteristic impedances of the coaxial cable 204 of the embodiment.
Figure 12B:
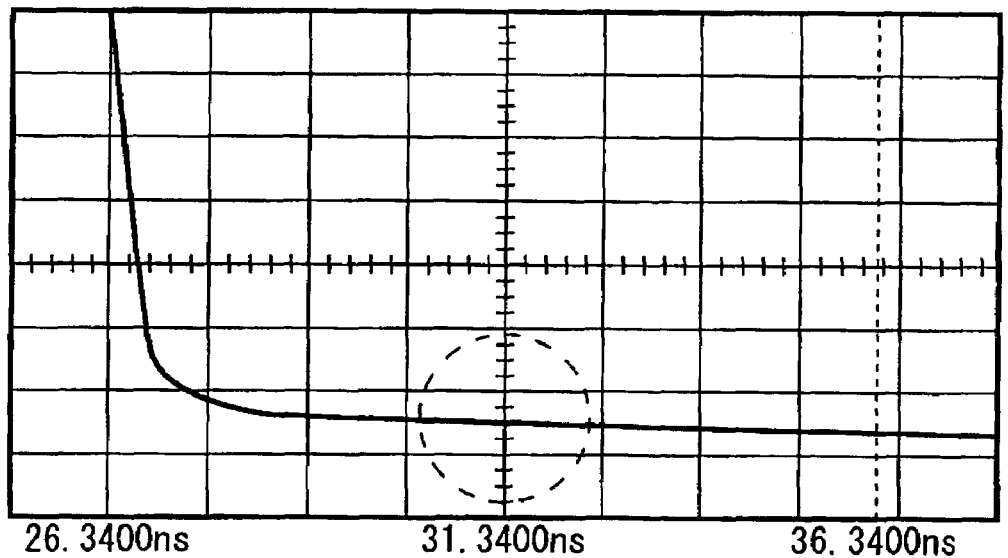

FIGS. 12A and 12B are graphs showing actually measured results of the value of characteristic impedance of the coaxial cable 204 of the embodiment. FIG. 12A shows the actually measured results of the value of characteristic impedance when a number of the coaxial cable 204 is one. In the actual measurement in FIG. 12A, the signal line 520 at one end of the coaxial cable 204 and the first and second shields 738 and 740 were connected with a SMA connector and the signal line 520 at the other end and the first and second shields 738 and 740 were connected in short circuit. FIG. 12B shows the result when the number of coaxial cables 204 is five. In the actual measurement in FIG. 12B, the signal lines 520 at one end of the coaxial cables 204 were connected with each other through the signal line connector 550 and the shields 530 were connected with each other through the shield connector 570 and were connected with the SMA connector. Still more, the signal lines 520 at the other end of the coaxial cables 204 were connected with each other through the signal line connector 550, the shields 530 were connected with each other through the shield connector 570 and the signal line connector 550 was connected with the shield connector 570 in short-circuit.

As shown in FIGS. 11 and 12A and 12B, the coaxial cable 204 based on the dimensions exemplified above realizes the coaxial cable having high threshold voltage and having the value of characteristic impedance of 2.0Ω to 2.5Ω by one cable and of 0.4Ω by five cables.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

As it is apparent from the above description, the invention allows the high precision current measurement to be performed by transmitting the current-under-measurement via the plurality of coaxial cables, by reducing the dispersion of the characteristic impedance of each coaxial cable and by realizing the low characteristic impedance.

What is claimed is:

1. A current measuring apparatus for measuring current-under-measurement flowing between a first measuring terminal and a second measuring terminal, comprising:
    a primary coil whose one end is electrically connected with said first measuring terminal and another end thereof is electrically connected with said second measuring terminal;
    a secondary coil that generates voltage representing said current-under-measurement corresponding to said current-under-measurement flowing through said primary coil; and
    a coaxial cable having a signal line that electrically connects said one end of said primary coil with said first measuring terminal and a shield; wherein said coaxial cable has said signal line;
    an insulating layer for coating said signal line;
    first one of said shield having a tape-like conductor wound around said insulating layer;
    second one of said shield composed of a conductor provided around an outer periphery of said first shield;
    a plurality of said primary coils wherein, said secondary coil generates the voltage representing said current-under measurement corresponding to said current-under-measurement flowing through said plurality of primary coils; and
    a plurality of said coaxial cables, each corresponding to each one of said plurality of primary coils, having the signal line for electrically connecting said one end of said corresponding primary coil with said first measuring terminal and the shield.

2. The current measuring apparatus as set forth in claim 1, further comprising:
    a resistor for connecting one end and another end of said secondary coil; wherein said current measuring apparatus outputs potential of said one end of said secondary coil as a value representing said current-under-measurement.

3. The current measuring apparatus as set forth in claim 1, further comprising a core around which said primary coil and said secondary coil are wound, respectively.

4. The current measuring apparatus as set forth in claim 1, wherein the current-under-measurement is divided to simultaneously flow into the plurality of said coaxial cables.

* * * * *